(12) United States Patent
Mathew et al.

(10) Patent No.: US 12,181,902 B2
(45) Date of Patent: Dec. 31, 2024

(54) HARDWARE SCHEME FOR DYNAMIC ADJUSTMENT OF DCDC CONVERTER PEAK CURRENT AND SAFE LDO DISABLE

(71) Applicant: TEXAS INSTRUMENTS INCORPORATED, Dallas, TX (US)

(72) Inventors: Rinu Mathew, Kerala (IN); Vineet Khurana, New Delhi (IN); Anand Kumar G, Bengaluru (IN); Aniruddha Periyapatna Nagendra, Bangalore (IN); Venkatesh Kadlimatti, Karnataka (IN); Torjus Lyng Kallerud, Oslo (NO)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 272 days.

(21) Appl. No.: 17/683,217

(22) Filed: Feb. 28, 2022

(65) Prior Publication Data

US 2023/0168700 A1 Jun. 1, 2023

(30) Foreign Application Priority Data

Nov. 13, 2021 (IN) .............................. 202141052087

(51) Int. Cl.
*H02M 1/00* (2007.01)
*G01R 17/04* (2006.01)
(Continued)

(52) U.S. Cl.
CPC ............. *G05F 1/462* (2013.01); *G01R 17/04* (2013.01); *H02M 1/0009* (2021.05);
(Continued)

(58) Field of Classification Search
CPC ............. H02M 1/0009; H02M 1/0012; H02M 1/0025; H02M 1/0032; H02M 1/0045;
(Continued)

(56) References Cited

U.S. PATENT DOCUMENTS 7,253,596 B2 * 8/2007 Yamamoto .......... H02M 3/1588
323/281
7,880,456 B2 * 2/2011 Falvey .................. H02M 3/158
323/224

(Continued)

FOREIGN PATENT DOCUMENTS

KR 20150040100 A * 4/2015 ............ H02M 3/156

*Primary Examiner* — Thienvu V Tran
*Assistant Examiner* — Shahzeb K Ahmad
(74) *Attorney, Agent, or Firm* — Mandy Barsilai Fernandez; Frank D. Cimino

(57) ABSTRACT

In an example, a device includes a controller and a direct current (DC)-to-DC converter coupled to the controller and configured to provide a load current to a load. The device also includes a low-dropout (LDO) regulator coupled to the DC-to-DC converter. The controller includes digital logic, and the digital logic is configured to determine the load current. The digital logic is configured to turn on the LDO regulator if the load current is above a predetermined threshold. The digital logic is also configured to turn off the LDO regulator if the load current is below the predetermined threshold.

20 Claims, 8 Drawing Sheets

(51) Int. Cl.
*G05F 1/46* (2006.01)
*H02M 3/156* (2006.01)
*H02M 3/157* (2006.01)

(52) U.S. Cl.
CPC ....... *H02M 1/0012* (2021.05); *H02M 1/0025* (2021.05); *H02M 1/0032* (2021.05); *H02M 1/0045* (2021.05); *H02M 1/0048* (2021.05); *H02M 3/156* (2013.01); *H02M 3/1566* (2021.05); *H02M 3/157* (2013.01)

(58) Field of Classification Search
CPC .. H02M 1/0048; H02M 3/156; H02M 3/1566; H02M 3/157; H02M 3/158; G05F 1/462; G01R 17/04
See application file for complete search history.

(56) References Cited

U.S. PATENT DOCUMENTS

| | | | | |
|---|---|---|---|---|
| 8,258,766 B1 * | 9/2012 | Sutardja | ................ | G05F 1/563 |
| | | | | 323/284 |
| 8,610,417 B1 * | 12/2013 | Sutardja | ................ | G05F 1/563 |
| | | | | 323/284 |
| 10,423,174 B1 * | 9/2019 | Sonntag | ................ | H02M 3/158 |
| 2005/0189931 A1 * | 9/2005 | Ishino | ................ | H02M 3/1584 |
| | | | | 323/282 |
| 2013/0162233 A1 * | 6/2013 | Marty | ................ | H02M 3/158 |
| | | | | 323/274 |
| 2013/0193941 A1 * | 8/2013 | DeFazio | ................ | G05F 1/46 |
| | | | | 323/282 |
| 2022/0321001 A1 * | 10/2022 | Huang | ................ | H02M 3/07 |

* cited by examiner

HARDWARE SCHEME FOR DYNAMIC ADJUSTMENT OF DCDC CONVERTER PEAK CURRENT AND SAFE LDO DISABLE

CROSS-REFERENCE TO RELATED APPLICATIONS

The present application claims priority to Indian Provisional Patent Application No. 202141052087, which was filed Nov. 13, 2021, is titled "Hardware Scheme for Dynamic Adjustment of DCDC Converter Peak Current and Safe LDO Disable," and is hereby incorporated herein by reference in its entirety.

BACKGROUND

A DC (direct current) to DC voltage converter receives an input voltage and converts it to an output voltage to drive a load. In an example, some microcontrollers include a DC-to-DC converter and a low-dropout voltage regulator (LDO regulator) that create a regulated DC supply voltage to drive the load. The DC-to-DC converter is used as the primary voltage regulator, and the LDO regulator is enabled for load sharing if needed to handle higher load currents or current spikes. The LDO regulator is disabled if the load current drops to a level that can be adequately handled by the DC-to-DC converter.

SUMMARY

In accordance with at least one example of the description, a device includes a controller and a DC-to-DC converter coupled to the controller and configured to provide a load current to a load. The device also includes an LDO regulator coupled to the DC-to-DC converter. The controller includes digital logic, and the digital logic is configured to determine the load current. The digital logic is also configured to turn on the LDO regulator if the load current is above a predetermined threshold. The digital logic is also configured to turn off the LDO regulator if the load current is below the predetermined threshold.

In accordance with at least one example of the description, a device includes a controller including digital logic. The digital logic includes a measurement window generator configured to generate a measurement window. The digital logic also includes a pulse counter configured to provide a count of charging pulses on an inductor coupled to a DC-to-DC converter during the measurement window. The digital logic also includes a latch configured to determine a percentage loading based on the count of charging pulses. The digital logic also includes a comparator configured to compare the percentage loading to a load threshold, where the comparator is further configured to disable an LDO regulator based on the comparison.

In accordance with at least one example of the description, a method includes providing a load current to a load with a DC-to-DC converter. The method also includes counting charging pulses during a measurement window, wherein the charging pulses produce the load current. The method also includes determining a percentage loading based on a count of the charging pulses. The method includes, responsive to the percentage loading being below a predetermined threshold, turning off an LDO regulator.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
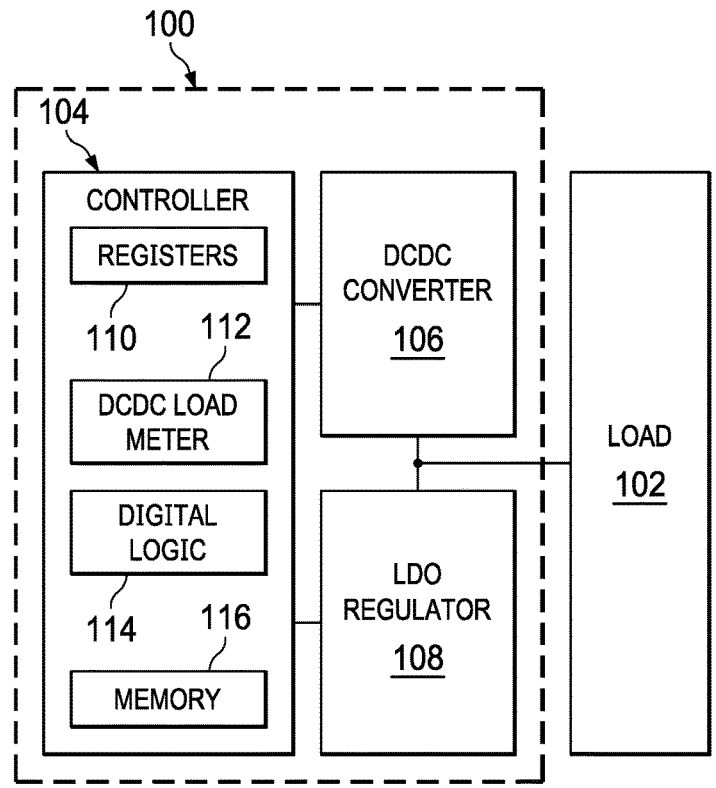
FIG. 1 is a block diagram of a system for dynamic adjustment of DCDC converter peak current and safe LDO regulator disabling in accordance with various examples.

A DC-to-DC voltage converter (referred to herein as a DCDC converter) and an LDO regulator may be useful for creating a stable voltage supply. To improve efficiency of the system, the DCDC converter is the primary voltage regulator, and the LDO regulator is enabled for load sharing to handle higher load current or current spikes. Due to inductor form factor constraints, the DCDC converter may not be able to handle large load currents. Therefore, the LDO regulator shares the load current with the DCDC converter when enabled. The LDO regulator may be disabled if the load current drops to a level that the DCDC converter can handle. The DCDC converter is designed to have a peak (e.g., a maximum) current setting at an optimal level for maximum efficiency. If the load current is higher than the peak current setting, the LDO regulator is enabled for load sharing.

Some alternative mechanisms for turning an LDO regulator on and off use analog circuitry. However, analog circuitry may turn the LDO regulator off at times when the DCDC converter is unable to handle the load current. The LDO regulator then turns back on, which creates an on/off cycle for the LDO regulator. The continuous on/off cycle for the LDO regulator may cause ripples on the regulated power supply that affect the radio frequency (RF) performance of the system.

In examples herein, digital logic and hardware manages the DCDC converter and LDO regulator. A DCDC load meter senses the load current delivered by the DCDC converter by counting charging pulses delivered to an energy storage device (e.g., an inductor and/or capacitor) over a predefined duration of time. The number of pulses is representative of the load current delivered by the DCDC converter. Responsive to the value of the load current sensed by the DCDC load meter, the LDO regulator may be safely enabled and disabled. Also, the DCDC converter has a peak current setting that may be adjusted based on changes in the load current to achieve greater efficiency. A user can set high and low predetermined threshold values for adjusting the peak current setting of the DCDC converter. If the load current rises above the high threshold value, the peak current setting of the DCDC converter may be increased. Increasing the peak current setting may allow the DCDC converter to handle the load current without turning on the LDO regulator in some examples, which helps to avoid the rapid on/off cycles for the LDO regulator. If the load current falls below the low threshold value, the peak current setting of the DCDC converter may be decreased, which improves the efficiency of the DCDC converter.

The examples herein provide a flexible and reliable scheme for safely enabling and disabling an LDO regulator. The examples may be managed through digital logic without requiring software in some examples. In other examples, software may be useful for adjusting the peak current setting by reading the load current value sensed by the DCDC load meter. The examples herein avoid the on/off LDO regulator cycling that degrades the RF performance of the system. DCDC operational efficiency is improved in the examples herein. In addition, flexibility is provided for a user to define the high and low threshold values for the peak current based on the user's specific application needs.

FIG. 1 is a block diagram of a system 100 for dynamic adjustment of a DCDC converter peak current and safe LDO regulator disabling in accordance with various examples herein. System 100 provides a load current to a load 102 in this example. System 100 includes a controller 104, a DCDC converter 106, and an LDO regulator 108. Controller 104 may be a processor, microprocessor, microcontroller, power management integrated circuit, system-on-a-chip, or any other device suitable for performing the operations herein. Controller 104 includes registers 110, DCDC load meter 112, digital logic 114, and memory 116. In some examples, the components shown in controller 104 may be implemented outside of controller 104. Controller 104 is coupled to DCDC converter 106 and LDO regulator 108. DCDC converter 106 and LDO regulator 108 provide a load current to load 102 in accordance with the examples herein.

In an example operation, DCDC converter 106 provides a load current to load 102. DCDC converter 106 has an adjustable peak current setting used to control when the DCDC converter 106 switches between charging and discharging an energy storage element. As one example, the peak current setting (e.g., $I_{PEAK}$) may be a number from 0 to 7. The peak current setting may be stored in memory 116 or a register 110. The peak current setting may be selected based on the load current demand to increase the efficiency of DCDC converter 106. As described below, DCDC load meter 112 and digital logic 114 may be configured to sense the load current provided to load 102. Responsive to sensing the load current, the peak current setting may be changed to achieve increased efficiency. As an example, if the load current demand is 5 milliamps (mA), a peak current setting of 10 mA may be more efficient than a peak current setting of 15 mA. As the load current demand increases, the peak current setting may be increased by controller 104, using digital logic 114, to meet the increased demand. Also, if LDO regulator 108 is needed to help meet the load current demand, DCDC load meter 112 and digital logic 114 may enable LDO regulator 108. If load current demand drops, or if DCDC converter 106 is able to handle the load current, digital logic 114 may disable LDO regulator 108. The details of the operation of DCDC load meter 112 and digital logic 114 are described below.

Figure 2:
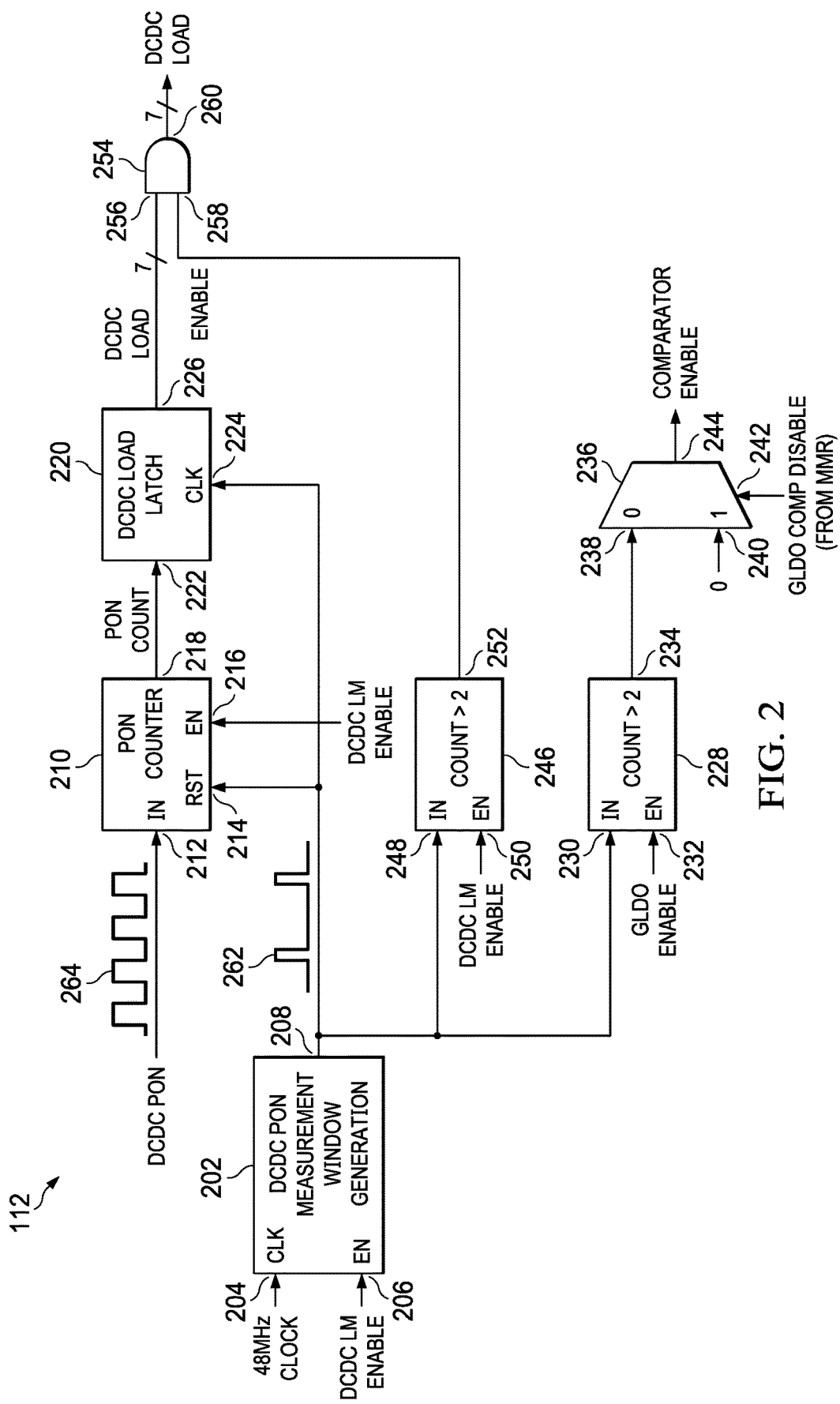
FIG. 2 is a block diagram of a DCDC load meter in accordance with various examples.

FIG. 2 is a block diagram of a DCDC load meter 112 in accordance with various examples herein. One example operation of DCDC load meter 112 is described below with respect to FIG. 3. Referring again to FIG. 2, the DCDC load meter 112 may be implemented using hardware and digital logic in one example. DCDC load meter 112 includes a DCDC pulse measurement window generator 202 (referred to herein as window generator 202). Window generator 202 includes a clock input 204, a DCDC load meter enable input 206, and an output 208. DCDC load meter 112 also includes a pulse "on" counter 210 (e.g., PON counter 210). PON counter 210 includes a DCDC PON input 212 that receives input pulses, a reset input 214, an enable input 216, and an output 218.

DCDC load meter 112 also includes a DCDC load latch 220. DCDC load latch 220 includes an input 222, a clock input 224, and an output 226. DCDC load meter includes a counter 228. Counter 228 includes an input 230, a global LDO (GLDO) enable input 232, and an output 234. DCDC load meter 112 includes a comparator 236. Comparator 236 has a first input 238 and a second input 240. Comparator 236 also has an enable input 242 and an output 244.

DCDC load meter 112 also includes a counter 246. Counter 246 includes an input 248 and a DCDC load meter enable input 250. Counter 246 includes an output 252. DCDC load meter also includes an AND gate 254. AND gate 254 includes a first input 256 and a second input 258. AND gate 254 includes an output 260.

Waveforms 262 and 264 are also shown in FIG. 2. The operation of waveforms 262 and 264 is further described below with respect to FIG. 3. In FIG. 2, waveform 262 is provided by window generator 202 at output 208. Waveform 262 indicates the measurement window for the operations described herein. The measurement window delineates a window of time during which charge pulses will be counted in order to determine a value of the load current being provided to a load 102. Waveform 262 is provided to reset input 214 of PON counter 210, to clock input 224 of DCDC load latch 220, to input 230 of counter 228, and to input 248 of counter 246. Waveform 262 provides a timing pulse to various components of DCDC load meter 112 to enable the synchronized operation of the components.

Waveform 264 is the collection of charging pulses provided to an energy storage device (e.g., an inductor and/or a capacitor) coupled to DCDC converter 106. DCDC converter 106 uses these charging pulses to provide a load current to load 102. In DCDC load meter 112, the charge pulses represented by waveform 264 are provided to PON counter 210 at DCDC PON input 212. PON counter 210 counts the number of charging pulses in waveform 264 during a measurement window.

In operation, window generator 202 receives a clock signal (e.g., a 48 Megahertz (MHz) clock signal) at clock input 204. A DCDC load meter enable signal is provided to DCDC load meter enable input 206 to turn on the DCDC load meter 112. The DCDC load meter enable signal may be provided by controller 104 in an example. After the DCDC load meter enable signal is received by window generator 202, window generator produces waveform 262 at output 208. Waveform 262 includes pulses that indicate the beginning of a measurement window. The measurement window is the duration of time during which the PON counter 210 will count charging pulses. In one example, the measurement window is the charge time of the DCDC converter 106 plus the discharge time of the DCDC converter 106, all multiplied by 100. The charge time and discharge time may vary based on the load in some examples. In some other examples, additional clock cycles may be added to the measurement window. Waveform 262 is provided to PON counter 210 at reset input 214. When a pulse from waveform 262 is provided to PON counter 210, PON counter 210 begins counting the number of charging pulses received at DCDC PON input 212, as represented by waveform 264. As shown in FIG. 2, PON counter 210 is also enabled by a DCDC load meter enable signal received at input 216, in the same manner that window generator 202 is enabled.

PON counter 210 counts the number of charging pulses during the measurement window. After the measurement window is complete (as indicated by another pulse from waveform 262 provided to reset input 214), PON counter 210 provides the count of the number of charging pulses to DCDC load latch 220. Then, the PON counter is reset so that it may count the number of charging pulses in the next measurement window.

The value captured in DCDC load latch 220 is a percentage loading measurement. For example, if the measurement window is 100 cycles, and PON counter 210 counts 90 charging pulses during the measurement window, the DCDC load value is 90% (e.g., 90/100). This value represents the load current as a percentage of the active $I_{PEAK}$ setting of the DCDC converter 106. This DCDC load value is provided to AND gate 254.

DCDC load meter 112 includes counters 228 and 246. Counter 228 is used for the safe LDO enable/disable scheme, which is described below. Counter 228 counts the number of measurement windows from waveform 262, which is provided to input 230 of counter 228. After a predetermined number of measurement windows (e.g., two measurement windows), a signal is provided from counter 228 to comparator 236 to produce a comparator enable signal at output 244. The digital comparator enable signal is described below with respect to FIGS. 4 and 5. Counter 228 keeps the LDO regulator 108 enabled for at least the predetermined number of measurement windows to help prevent rapid LDO on/off cycling.

Counter 246 also counts the number of measurement windows by receiving waveform 262 at input 248. Counter 246 is enabled with a DCDC load meter enable signal provided to input 250. After counter 246 has counted more than a predetermined number of measurement windows (e.g., two measurement windows), counter 246 provides a signal at output 252. The signal from output 252 is provided to AND gate 254 to enable AND gate 254. The AND gate 254 is enabled to provide a DCDC load value at output 260 after the predetermined number of measurement windows. The DCDC load value at output 260 is provided after the predetermined number of measurement windows for stability and reliability.

Figure 3:
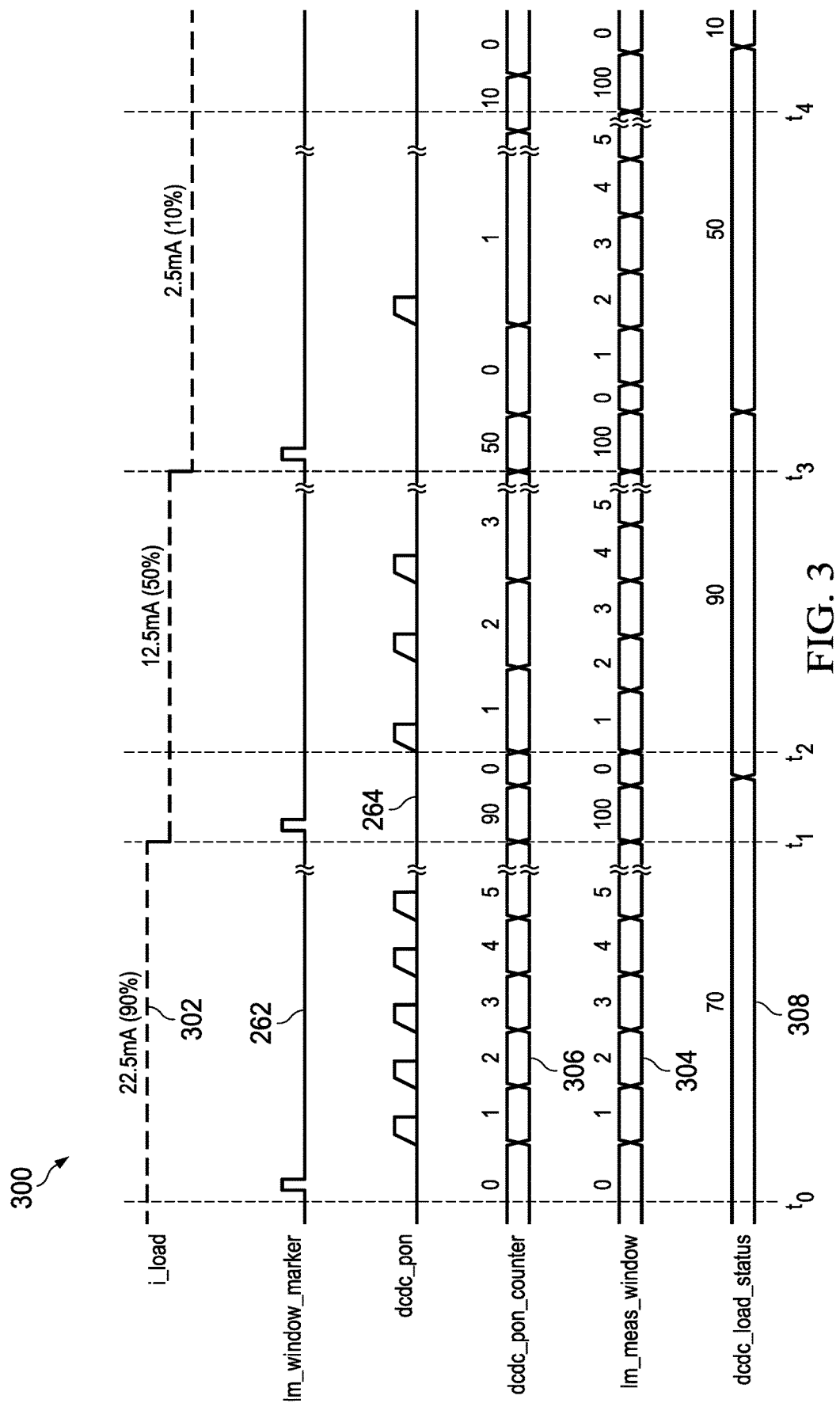
FIG. 3 is a collection of waveforms that describe the operation of a DCDC load meter in accordance with various examples.

FIG. 3 is a collection of waveforms 300 that describe the operation of DCDC load meter 112 in accordance with various examples herein. Waveforms 300 includes waveform 262, which is referred to as the load meter window marker (lm_window_marker). Waveform 262 includes pulses that indicate the beginning of a measurement window. Waveform 264 represents the charging pulses, which are referred to as dcdcp_on. Waveform 302 represents the load current provided to load 102, referred to as I_load. Waveform 304 represents the load meter measurement window (lm_meas_window). Waveform 306 represents the count of pulses from PON counter 210 (dcdc_pon_counter). Waveform 308 represents the DCDC load status, which is the DCDC load value measured as a percentage of the peak current (dcdc_load_status).

An example operation begins at time $t_0$. In this example, the peak current setting is 25 mA. The peak current setting sets a limit on the maximum current that can be delivered by DCDC converter 106. However, the peak current through the inductor may be a higher value than the peak current setting. In FIG. 3, before time $t_0$, the DCDC load value is 70% (indicated in waveform 308). Therefore, waveform 308 shows 70 as the initial DCDC load value, and this value will remain at 70 until a measurement window occurs and the DCDC load value is updated. The load current (waveform 302) at time $t_0$ is 22.5 mA, which is 90% of the peak current setting of 25 mA. At time to, a pulse occurs on waveform 262, which indicates the beginning of a measurement window. As shown in FIG. 2, a pulse on waveform 262 causes the PON counter 210 to begin counting pulses. Also, the count also begins for the measurement window.

In this example, at time $t_0$, the measurement window (waveform 304) begins to count from 1 to 100. After the count of 100 is reached, the measurement window is complete and a new measurement window may begin. Also, at time $t_0$, PON counter 210 begins counting the pulses on waveform 264 (dcdc_pon). At time $t_1$, the count of 100 is reached for the measurement window (waveform 304). At time $t_2$, the PON counter 210 has counted 90 pulses on waveform 264. Therefore, the DCDC load status is now 90%. Accordingly, waveform 308 will update the new DCDC load status to 90 after time $t_1$.

Just after time $t_1$, another pulse appears on waveform 262. This pulse indicates the start of a new measurement window. In this example, the load current (waveform 302) has dropped to 12.5 mA during this second measurement window. A load current of 12.5 mA is 50% of the peak current setting of 25 mA. The second measurement window begins at time $t_2$. At time $t_2$, waveform 304 shows the count for the measurement window resets and begins counting from 1 to 100 again. Also, at time $t_2$, the PON counter 210 resets and begins counting pulses on waveform 264 again, beginning with the first pulse at time $t_2$.

The second measurement window continues until time $t_3$. At time $t_3$, the count of 100 is reached for the measurement window (waveform 304). At time $t_3$, the PON counter 210 has counted 50 pulses on waveform 264. Therefore, the DCDC load status is now 50%. Accordingly, waveform 308 will update the new DCDC load status to 50 after time $t_3$.

After time $t_3$, a third measurement window begins. During this measurement window, the load current is 2.5 mA, which is 10% of the peak current setting. As shown in FIG. 3, at time $t_4$ the third measurement window has ended with a pulse count of 10 shown in waveform 306. Waveform 308 updates the DCDC load status to 10 after time $t_4$.

This processes continues as long as the DCDC load meter 112 is enabled. The PON counter 210 counts pulses and updates the DCDC load status after each measurement window. In some examples, more than one measurement window may occur before the DCDC load status is updated. The DCDC load status indicates the percentage of the load current as compared to the peak current for the DCDC converter 106. As described herein, if the DCDC load status is above a predetermined threshold, the peak current setting may be increased, to allow the DCDC converter 106 to provide more current to load 102. Also, the LDO regulator 108 may be enabled, if needed, to share the load current. The threshold may be set by a user. For example, the upper threshold may be 80%. If the DCDC load status is above 80% in this example, the peak current setting for the DCDC converter 106 may be increased. The user may also set a lower threshold. For example, the lower threshold may be 50%. If the DCDC load status falls below 50%, the peak current setting for the DCDC converter may be decreased. With a lower peak current setting, the DCDC converter 106 will have a lower maximum amount of current that it can provide to drive the load, but the DCDC converter 106 may run more efficiently than with a higher peak current setting.

FIGS. 2 and 3 show that the DCDC load meter uses digital hardware and logic to sense the load current delivered by the DCDC converter 106. Charging pulses are counted over a predetermined window of time, and the charging pulses are representative of the load current. After the DCDC load status has been determined, additional actions may be performed, such as enabling or disabling the LDO regulator 108 or adjusting the peak current setting. These additional actions are described below.

Figure 4:
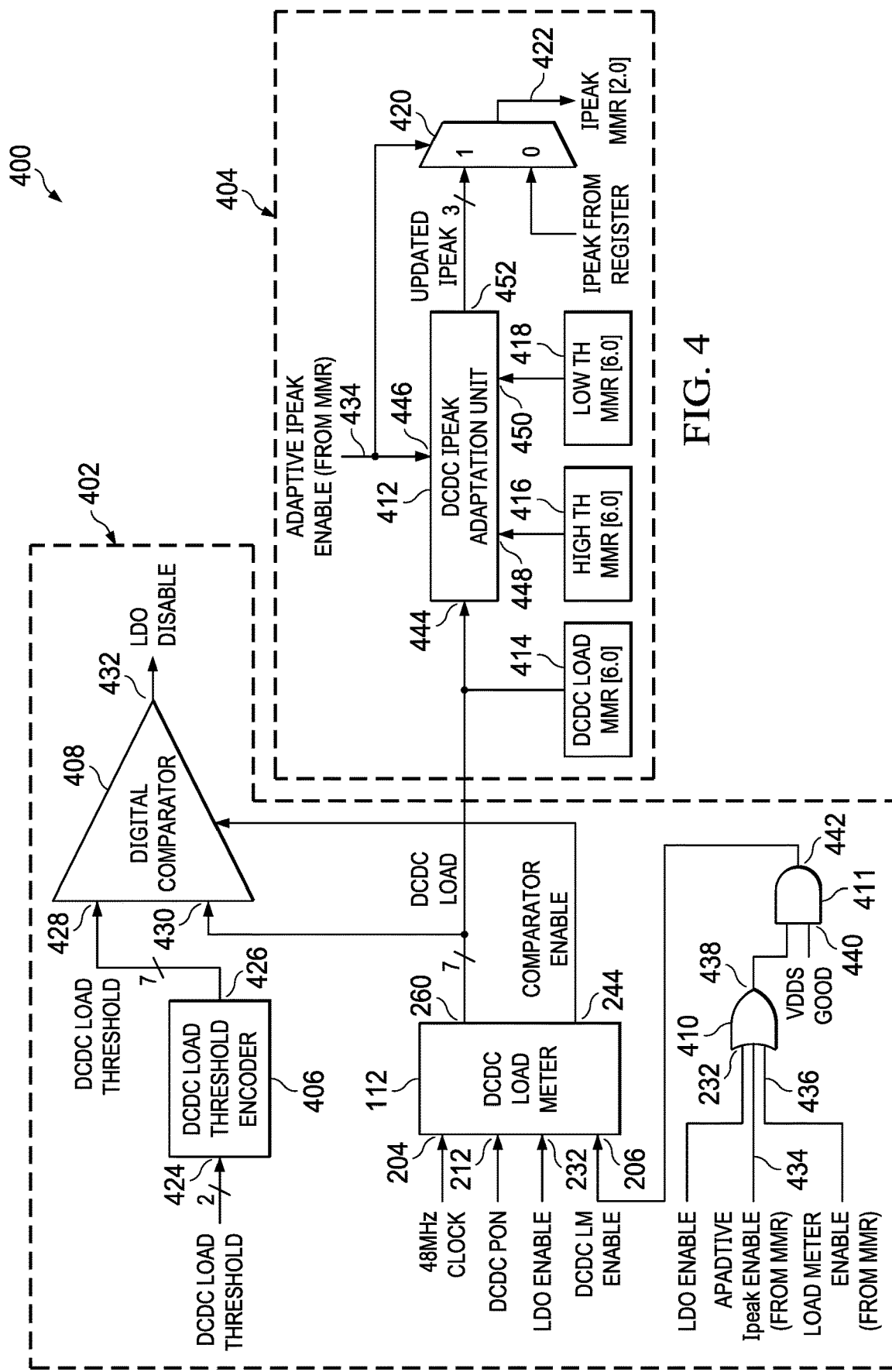
FIG. 4 is a block diagram of a system for a safe LDO turn-off scheme in accordance with various examples.

FIG. 4 is a block diagram of a system 400 for a safe LDO turn-off scheme in accordance with various examples herein. System 400 provides a mechanism for safely enabling and disabling the LDO regulator 108 while avoiding the unwanted on/off cycling of the LDO regulator 108. In an example, the LDO regulator 108 is enabled if the DCDC converter 106 is incapable of handling the load for a given peak current setting. For example, if the DCDC converter 106 is operating at a specific current setting (such as 3 on a scale of 0 to 7), there is a certain maximum current that the DCDC converter 106 can deliver to the load. This current could be 15 mA in one example. If there is a spike in current above this maximum, the LDO regulator 108 is enabled for current sharing. Additionally, in examples herein, controller 104 may increase the peak current setting for the DCDC converter 106 to handle the load. The peak current setting may be increased from 3 to 4 or 5 in this example. After the peak current setting has increased and the DCDC converter 106 is able to handle the load current, the LDO regulator 108 may be disabled. If the peak current setting is at the maximum and the DCDC converter 106 is unable to handle the load, the LDO regulator 108 may be enabled. The LDO regulator 108 will remain on until the load current drops to a level that the DCDC converter 106 can handle. In some examples herein, a digital comparator compares the DCDC load meter 112 output with a predetermined threshold value that is programmed during device boot and stored in a register. In some such examples, this threshold value cannot be changed by a user. The threshold value provides some margin for the maximum DCDC load current for a selected peak current setting. This margin is described below. System 400 includes hardware and digital logic that implements the scheme described above.

System 400 includes components 402, which are the components for the LDO regulator 108 disable scheme. Components 404 are the components that enable the adaptive peak current scheme, which adjusts the peak current setting as described above. The components in system 400 may be located in controller 104 in one example.

Components 402 includes DCDC load meter 112, DCDC load threshold encoder 406, comparator 408, OR gate 410, and AND gate 411. Components 404 include DCDC peak current ($I_{PEAK}$) adaptation unit 412, DCDC load register 414, high threshold register 416, low threshold register 418, multiplexer 420, and $I_{PEAK}$ register 422.

DCDC load meter 112 includes four inputs. These inputs are clock input 204, DCDC PON input 212, LDO enable input 232, and DCDC load meter enable input 206. DCDC load meter 112 provides a comparator enable signal at output 244 and a DCDC load value at output 260. The inputs and outputs of DCDC load meter 112 are described above with respect to FIG. 2.

DCDC load threshold encoder 406 includes a DCDC load threshold input 424. The DCDC load threshold input 424 may provide a value to DCDC load threshold encoder 406 that is stored in a register. DCDC load threshold encoder 406 produces an output value at output 426. The output value is provided to a first input 428 of comparator 408. The second input 430 of comparator 408 receives the DCDC load value from output 260. Comparator 408 includes an output 432, that disables the LDO regulator 108 as described below.

OR gate 410 includes three inputs: an LDO enable input 232, an adaptive $I_{PEAK}$ enable signal 434, and a load meter enable 436. The adaptive $I_{PEAK}$ enable signal 434 may be a value stored in a register. The load meter enable 436 may receive a value stored in a register. OR gate 410 includes an output 438 that is provide to AND gate 411. A VDDS good signal 440 is also provided to AND gate 411. The VDDS good signal 440 indicates that the primary voltage supply is adequate for DCDC converter 106 to operate. AND gate 411 provides an output signal at output 442.

The OR gate 410 inputs provide multiple conditions where DCDC load meter 112 may be enabled. First, if the LDO regulator 108 is enabled for load current sharing, LDO enable input 232 is provided to OR gate 410, which in turn provides an enable signal from output 442 to DCDC load meter enable input 206. Second, DCDC load meter 112 may be enabled via software, with a configuration bit that can be set to enable DCDC load meter 112 via load meter enable 436. Third, DCDC load meter 112 may be enabled with an adaptive $I_{PEAK}$ enable signal 434 provided to OR gate 410. The $I_{PEAK}$ enable signal may be stored in a register in one example. The $I_{PEAK}$ enable signal 434 is described below.

In an example operation, DCDC load meter 112 provides the measured DCDC load value (as a percentage) from output 260 to comparator 408. The comparator enable signal at output 244 is also provided from the DCDC load meter 112 to the comparator 408. The DCDC load value and the comparator enable signal are provided as described above with respect to FIG. 2. In one example, the comparator enable signal is only generated after two measurement cycles of the DCDC load meter 112.

Comparator 408 compares the DCDC load value at input 430 to the DCDC load threshold at input 428. As a result of the comparison, comparator 408 disables the LDO regulator 108 if the DCDC load value goes below the DCDC load threshold value from DCDC load threshold encoder 406.

For the DCDC load threshold encoder 406, the DCDC load threshold input 424 provides an internal programmed register value that represents a predetermined load threshold. The DCDC load threshold encoder 406 converts the two bits at DCDC load threshold input 424 to one of the possible threshold settings. As an example, if DCDC load threshold encoder 406 generates 90% as a reference value for the comparator 408, and DCDC load value from the DCDC load meter 112 is less than 90%, then the LDO regulator 108 can be safely disabled. The DCDC load threshold encoder 406 provides some margin with respect to the maximum current that the DCDC converter 106 can deliver. This margin helps avoid a false LDO disable signal. The LDO regulator 108 is disabled by the comparator 408 when the DCDC load value goes below the threshold (90%, 85%, etc.) from DCDC load threshold encoder 406. The LDO disable signal from output 432 may be provided to analog circuitry that disables the LDO regulator 108.

The components 404 of the adaptive peak current scheme receive the DCDC load value from output 260 of DCDC load meter 112. DCDC $I_{PEAK}$ adaptation unit 412 receive the DCDC load value at input 444. The DCDC load value may also be stored in DCDC load register 414. An adaptive $I_{PEAK}$ enable signal 434 is provided to DCDC $I_{PEAK}$ adaptation unit 412 at input 446. The adaptive $I_{PEAK}$ enable signal 434 is the same signal provided to the input of OR gate 410. This signal turns on the adaptive $I_{PEAK}$ scheme. DCDC $I_{PEAK}$ adaptation unit 412 receives a high threshold value at input 448 from high threshold register 416 and a low threshold value at input 450 from low threshold register 418. DCDC $I_{PEAK}$ adaptation unit 412 provides an updated $I_{PEAK}$ value at output 452. The updated $I_{PEAK}$ value from the DCDC $I_{PEAK}$ adaptation unit 412 is the new $I_{PEAK}$ setting. If the $I_{PEAK}$ enable signal 434 is not active, multiplexer 420 selects the $I_{PEAK}$ value from a register, which stores a user default setting for $I_{PEAK}$. This default value may be stored in a configurable register. The new $I_{PEAK}$ value that is output from multiplexer 420 is stored in an $I_{PEAK}$ register 422 when the $I_{PEAK}$ enable signal 434 is active. The operation of DCDC $I_{PEAK}$ adaptation unit 412 to select the new $I_{PEAK}$ value is described below with respect to FIGS. 6 and 7. Digital logic and a state machine within DCDC $I_{PEAK}$ adaptation unit 412 may select the new $I_{PEAK}$ value in an example.

Figure 5:
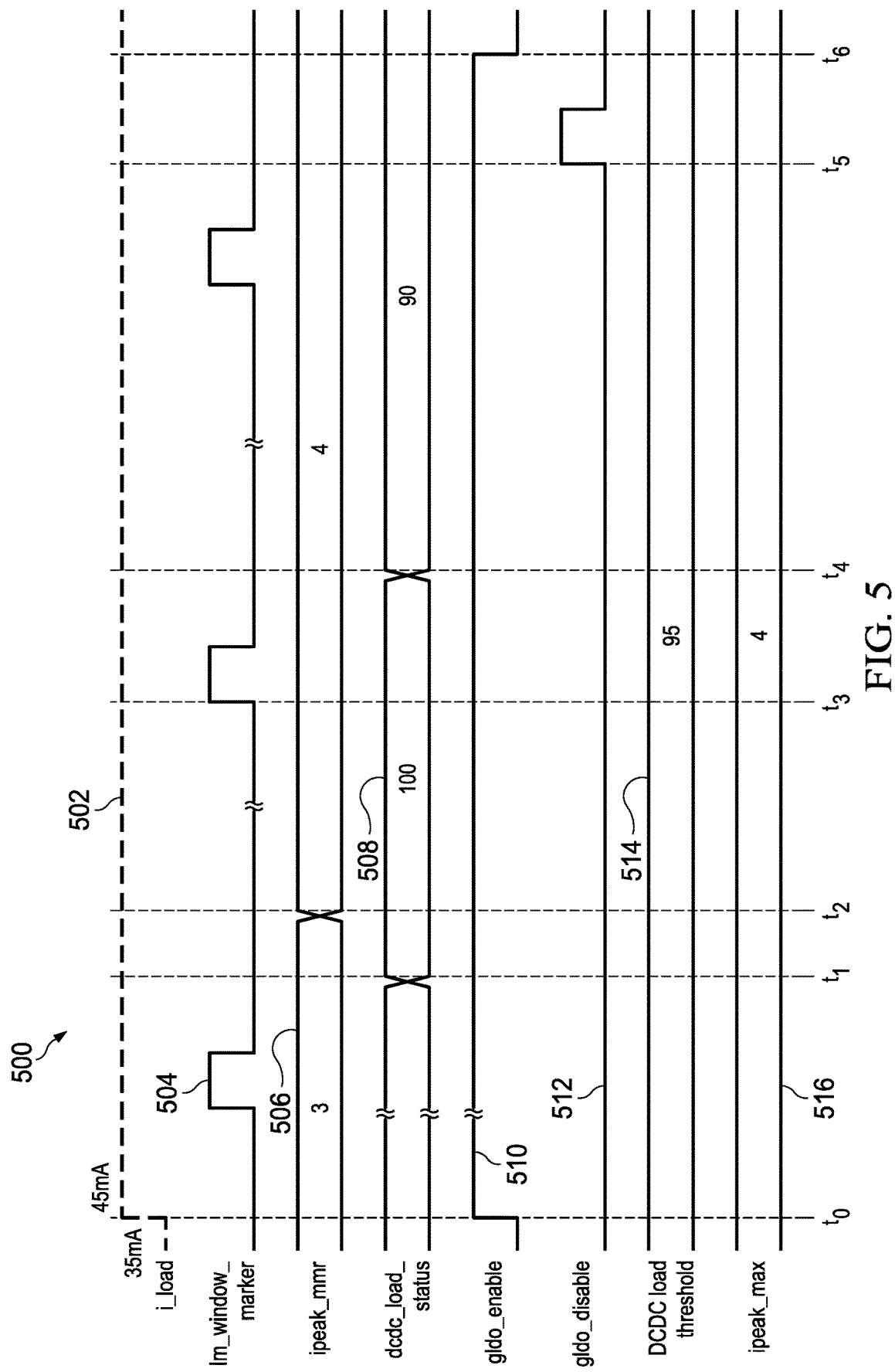
FIG. 5 is a collection of waveforms that show the operation of a safe LDO disable operation in accordance with various examples.

FIG. 5 is a collection of waveforms 500 that show the operation of a safe LDO disable operation in accordance with various examples herein. The safe LDO disable scheme may be performed by the digital logic in FIG. 4 in one example. Waveform 502 represents the load current $I_{LOAD}$. Waveform 504 represents the DCDC load meter 112 window marker (lm_window_marker). Waveform 506 represents the $I_{PEAK}$ value, which may be stored in a memory mapped register (MMR) (ipeak_mmr). In an example, the $I_{PEAK}$ value may be a setting between 0 and 4, where 0 is the lowest $I_{PEAK}$ value and 4 is the highest $I_{PEAK}$ value. Waveform 508 is the DCDC load value (dcdc_load_status), which is expressed as a percentage. The DCDC load value may be the value at output 260 in one example. Waveform 510 is the LDO enable status (gldo_enable). A low value on waveform 510 indicates that the LDO regulator 108 is disabled, and a high value on waveform 510 indicates that the LDO regulator 108 is enabled. Waveform 512 is the LDO disable signal (gldo_disable), which goes high to cause gldo_enable to disable the LDO regulator 108. Waveform 514 represents the DCDC load threshold value. This value may be stored in a register and is provided to DCDC load threshold encoder 406 as described above with respect to FIG. 4. The DCDC load threshold value is a percentage value, and is set at 95% in this example. Waveform 516 represents the maximum $I_{PEAK}$ value (ipeak_max), which is 4 in this example.

In an example operation, the initial load current is 35 mA (waveform 502). At time $t_0$, the load current increases to 45 mA. Responsive to the load current increase, the LDO enable signal (waveform 510) goes up. The increase in the load current may be sensed by analog circuitry in one example. The load meter window marker (waveform 504) shows a pulse that begins a load meter measurement window. At time $t_1$, the load meter measurement cycle ends. The DCDC load meter shows a value of 100 after the measurement cycle (waveform 508). The LDO regulator remains on after time $t_1$ (waveform 510). As shown in waveform 514, the DCDC load threshold is 95%. Because the load meter value (waveform 508) is 100 and the DCDC load threshold is 95, the LDO regulator 108 remains enabled after time $t_1$. However, the $I_{PEAK}$ setting can be increased. At time $t_2$, the $I_{PEAK}$ setting is increased from 3 to 4 (waveform 506). The $I_{PEAK}$ setting may be increased with components 404 in FIG. 4, or as described below with respect to FIGS. 6 and 7.

At time $t_3$, a second measurement window begins (waveform 504). At time $t_4$, the DCDC load meter reports the DCDC load status as 90% (waveform 508). The DCDC load status of 90% is now below the DCDC load threshold of 95% (waveform 514). As described above with respect to FIG. 4, the DCDC load status and the DCDC load threshold are provided to comparator 408. If the DCDC load status is below the DCDC load threshold, the comparator 408 disables the LDO regulator 108. As shown in waveform 512, the LDO disable signal goes high at time $t_5$. Responsive to the LDO disable signal going high, the LDO enable signal (waveform 510) goes low at time $t_6$. The LDO regulator 108 is therefore disabled.

FIG. 5 shows that the LDO regulator 108 and the $I_{PEAK}$ setting may both be changed responsive to changes in the load current. If the $I_{PEAK}$ setting is at its maximum value, the LDO regulator 108 may stay on until the load current goes below the DCDC load threshold.

Figure 6:
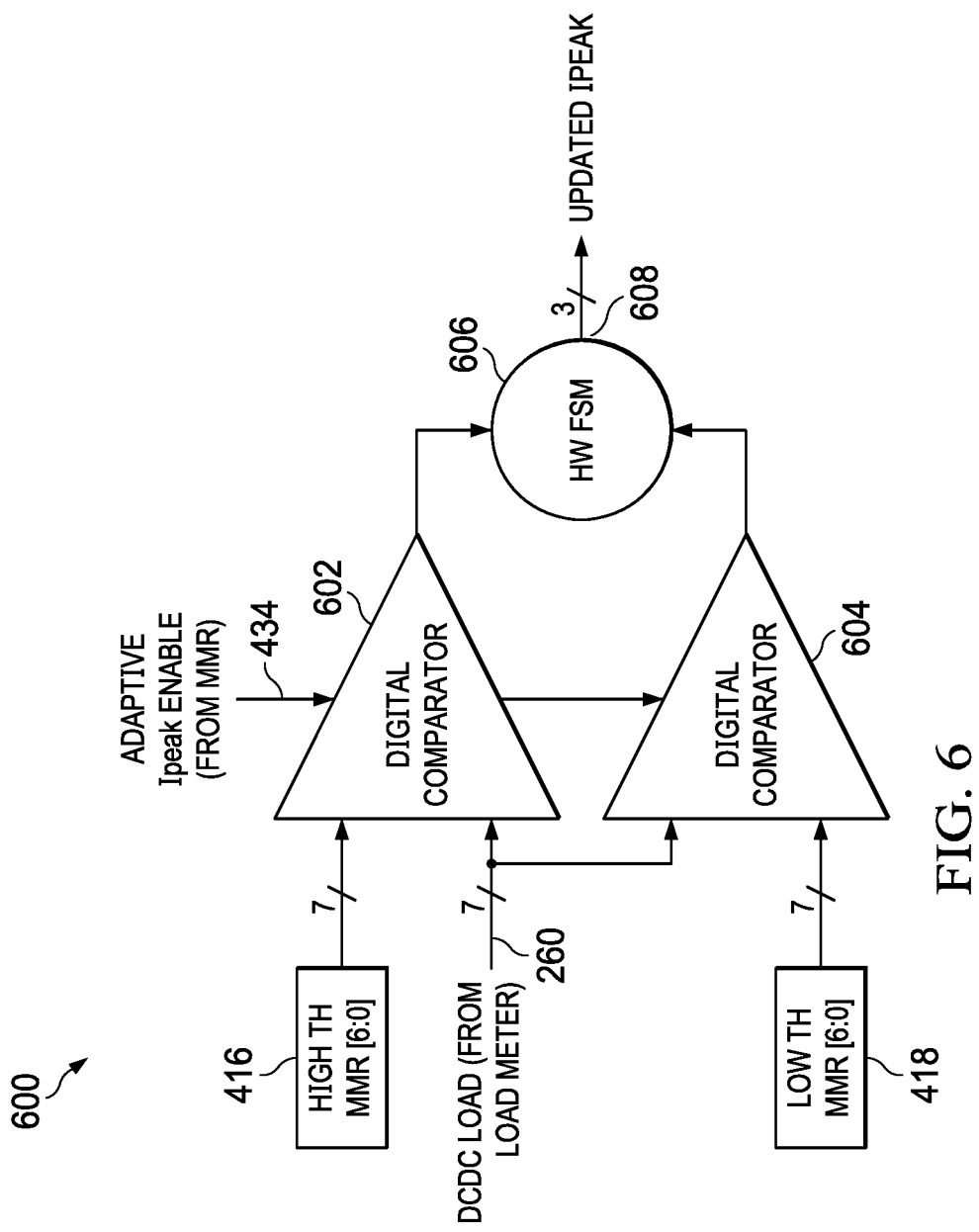
FIG. 6 is a block diagram of a system for adaptive DCDC peak current adjustment in accordance with various examples.

FIG. 6 is a block diagram of a system 600 for adaptive DCDC peak current adjustment in accordance with various examples herein. In an example, a user configurable bit enables the adaptive DCDC converter peak current adjustment scheme in hardware or digital logic. Adaptive $I_{PEAK}$ enable signal 434 in FIG. 4 is one example of this bit. Also, a user can configure high and low threshold values (as percentages) for the adaptive $I_{PEAK}$ adjustment scheme. For example, the high threshold may be set to 80% and the low threshold may be set to 50%. If the adaptive $I_{PEAK}$ scheme is enabled, the DCDC load meter output is compared against the high and low threshold values by hardware or digital logic. If the DCDC load meter output is between the high and low threshold values, the $I_{PEAK}$ setting is retained. If the DCDC load meter output goes higher than the high threshold, then hardware increases the $I_{PEAK}$ setting by one count. At the same time, the LDO regulator 108 may be turned on for a short time during the $I_{PEAK}$ setting adjustment. The LDO regulator 108 is turned off if the DCDC converter 106 can handle the load current after the $I_{PEAK}$ setting adjustment. If the DCDC load meter output goes lower than the low threshold, then hardware decreases the $I_{PEAK}$ setting by one count. The LDO regulator 108 remains disabled when the peak current setting is decremented, because there is no need for load current sharing in that scenario.

System 600 includes a comparator 602, a comparator 604, and a hardware finite state machine (HW FSM) 606. In system 600, the DCDC load value is compared to the high and low thresholds. Based on the outputs from the comparators 602 and 604, the HW FSM 606 adjusts the $I_{PEAK}$ setting.

In an example, the adaptive $I_{PEAK}$ enable signal 434 enables the adaptive $I_{PEAK}$ scheme by enabling the comparators 602 and 604. A high threshold register 416 stores the user configured high threshold value, and a low threshold register 418 stores the user configured low threshold value. The threshold values may be expressed in percentages, such as 80% and 50%. If the DCDC load value is between 80% and 50% of the $I_{PEAK}$ setting, that information is provided to HW FSM 606 and no change is made to the $I_{PEAK}$ setting. If the DCDC load value is above the high threshold (e.g., above 80% of the $I_{PEAK}$ setting), the $I_{PEAK}$ setting may be incremented by the HW FSM 606. If the DCDC load value is below the low threshold (e.g., below 50% of the $I_{PEAK}$ setting), the $I_{PEAK}$ setting may be decremented by the HW FSM 606. The HW FSM 606 provides the updated $I_{PEAK}$ setting at its output 608.

Figure 7:
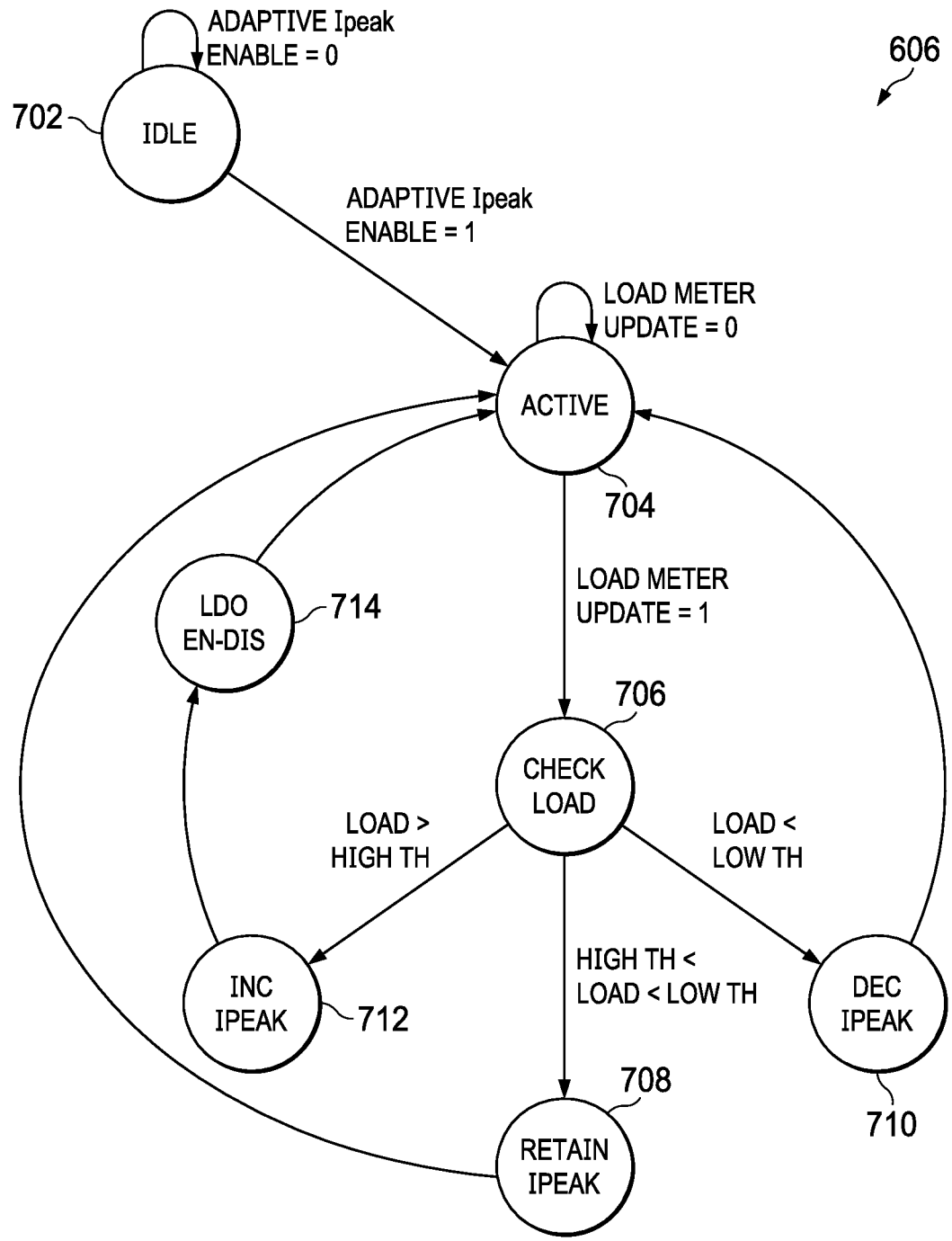
FIG. 7 is a hardware finite state machine for an adaptive $I_{PEAK}$ scheme in accordance with various examples.

FIG. 7 is a hardware finite state machine 606 for an adaptive $I_{PEAK}$ scheme in accordance with various examples herein. The HW FSM 606 may be implemented in controller 104 in one example. In another example, the HW FSM 606 may implemented in any suitable hardware.

If the adaptive $I_{PEAK}$ scheme is not enabled, the HW FSM 606 remains in the idle state 702. The adaptive $I_{PEAK}$ scheme may be enabled by a user. After the scheme is enabled, the HW FSM 606 moves to the active state 704. If no update is received from the DCDC load meter 112, the HW FSM 606 remains in the active state (load meter update=0). Then, if the DCDC load meter 112 reports a value, the HW FSM 606 moves to check load state 706 (load meter update=1). After the DCDC load meter 112 reports a load value, the load value is checked against the user configured high and low thresholds in check load state 706.

If the measured value is between the low and high thresholds, the $I_{PEAK}$ setting is retained at retain $I_{PEAK}$ state 708. After state 708, the HW FSM 606 returns to active state 704. If the value at check load state 706 is below the low threshold, the HW FSM 606 moves to state 710, where the $I_{PEAK}$ setting is decremented (Dec $I_{PEAK}$). After state 710, the HW FSM 606 returns to active state 704. If the value at check load state 706 is above the high threshold, HW FSM 606 moves to state 712, where the $I_{PEAK}$ setting is incremented (Inc $I_{PEAK}$). After state 712, the LDO regulator 108 is enabled for a short duration and then disabled automatically at state 714. Also, if the peak current setting is at the maximum value, the LDO regulator 108 may continue to remain on until the load drops within the capacity of the DCDC converter 106.

Figure 8:
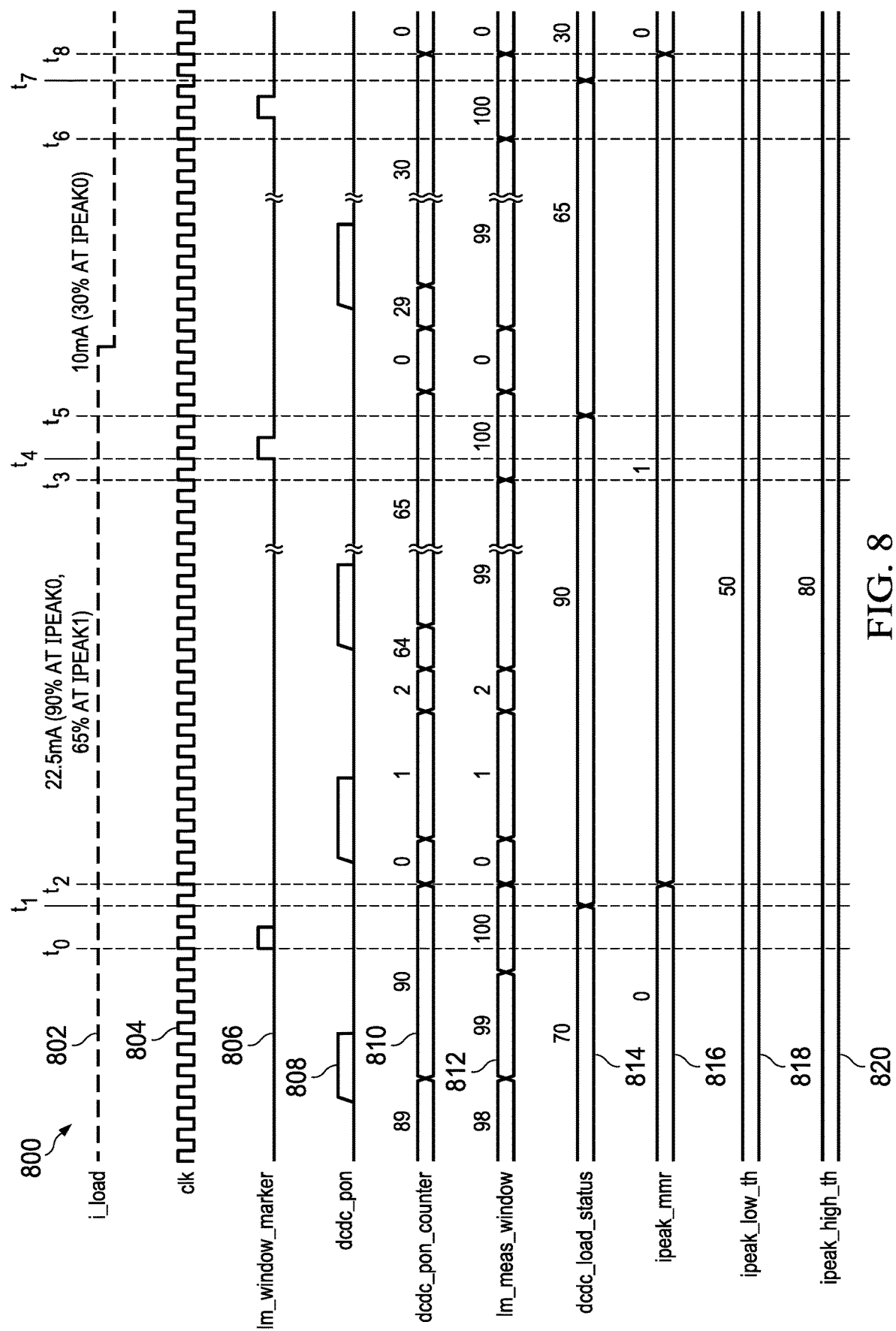
FIG. 8 is a collection of waveforms for an adaptive $I_{PEAK}$ scheme in accordance with various examples.

FIG. 8 is a collection of waveforms 800 for an adaptive $I_{PEAK}$ scheme in accordance with various examples herein. The adaptive $I_{PEAK}$ scheme may be implemented in hardware or digital logic. In one example, an $I_{PEAK}$ setting 0 corresponds to a peak current of 25 mA, and an $I_{PEAK}$ setting 1 corresponds to a peak current of 35 mA. The high and low thresholds are 80% and 50%, respectively. If the DCDC load meter output value reaches 90% on setting 0 (e.g., 22.5 mA), the hardware increases the $I_{PEAK}$ setting from 0 to 1. After the $I_{PEAK}$ setting is changed to 1, the peak current is 35 mA. The DCDC load meter value of 22.5 mA is between 80% and 50% of the new $I_{PEAK}$ setting of 35 mA. If the load current drops to 10 mA, the $I_{PEAK}$ setting may be decremented from 1 back to 0. Therefore, the adaptive $I_{PEAK}$ scheme keeps the peak current setting at an optimal level with respect to load current to improve efficiency. Also, adjusting the peak current setting avoids using the LDO regulator 108 for load sharing if the DCDC converter 106 is capable of handling the load current. Without this adaptive $I_{PEAK}$ scheme, LDO regulator 108 would have to turn on and off more often to handle increases in load current.

Waveform 802 represents the load current (i_load). Waveform 804 is a clock signal (clk). Waveform 806 represents the load meter window markers (lm_window_marker). Waveform 808 represents the collection of charging pulses provided to an inductor coupled to DCDC converter 106 (dcdc_pon). Waveform 810 represents the count of pulses from PON counter 210 (dcdc_pon_counter). Waveform 812 represents the load meter measurement window (lm_meas_window). Waveform 814 represents the DCDC load status, which is the DCDC load value measured as a percentage of the peak current (dcdc_load_status). Waveform 816 represents the $I_{PEAK}$ setting, which may be stored in a register (ipeak_mmr). Waveform 818 represents the user configurable low threshold, which is 50% in this example. Waveform 820 represents the user configurable high threshold, which is 80% in this example.

In an example operation, a first measurement window ends at time $t_0$. At time $t_0$, the load current is 22.5 mA (waveform 802), which is 90% of the peak current if the $I_{PEAK}$ setting is 0. At time $t_0$, the $I_{PEAK}$ setting is 0 and the DCDC load status is 70 (waveform 814). At the end of the first measurement window at time $t_0$, the PON counter 210 has counted 90 pulses (waveform 810), due to the load current being 22.5 mA. Therefore, after time $t_0$, the DCDC load status is updated to 90 (waveform 814). The DCDC load status is updated at time $t_1$ (waveform 814). Because the DCDC load status is updated to 90 at time $t_1$, the DCDC load status is above the high threshold of 80. Therefore, the $I_{PEAK}$ setting should be incremented. At time $t_2$, the $I_{PEAK}$ setting is incremented from 0 to 1 (waveform 816). With an $I_{PEAK}$ setting of 1, the peak current is 35 mA. Load current at time $t_1$ is still 22.5 mA, and 22.5 mA is below 80% of 35 mA, which is the new peak current setting. Therefore, after updating the $I_{PEAK}$ setting from 0 to 1, the load current is between the 50% and 80% thresholds set by the user.

Time $t_0$ represents the beginning of a second measurement window, as shown by the load meter window marker in waveform 806. The end of the second measurement window occurs at time $t_3$. At time $t_3$, the PON counter 210 has counted 65 pulses (waveform 810), due to the load current being 22.5 mA with a peak current setting of 35 mA. At time $t_5$, the DCDC load status is updated (waveform 814). The $I_{PEAK}$ setting remains at 1 at time $t_5$.

Time $t_4$ represents the beginning of a third measurement window. The third measurement window ends at time $t_6$. During the third measurement window, the load current drops to 10 mA (waveform 802). Therefore, PON counter 210 has counted 30 pulses (waveform 810) during the third measurement window. At time $t_7$, the DCDC load status is updated to 30 (waveform 814). The DCDC load status of 30 is below the low threshold value of 50 (waveform 818). Therefore, the $I_{PEAK}$ setting may be decremented from 1 to 0. At time $t_8$, the $I_{PEAK}$ setting is decremented from 1 to 0 (waveform 816). This process of updating the DCDC load status after each measurement window and updating the $I_{PEAK}$ setting if the DCDC load status is outside the high and low threshold values may continue after time $t_8$ in a manner similar to that described above.

Figure 9:
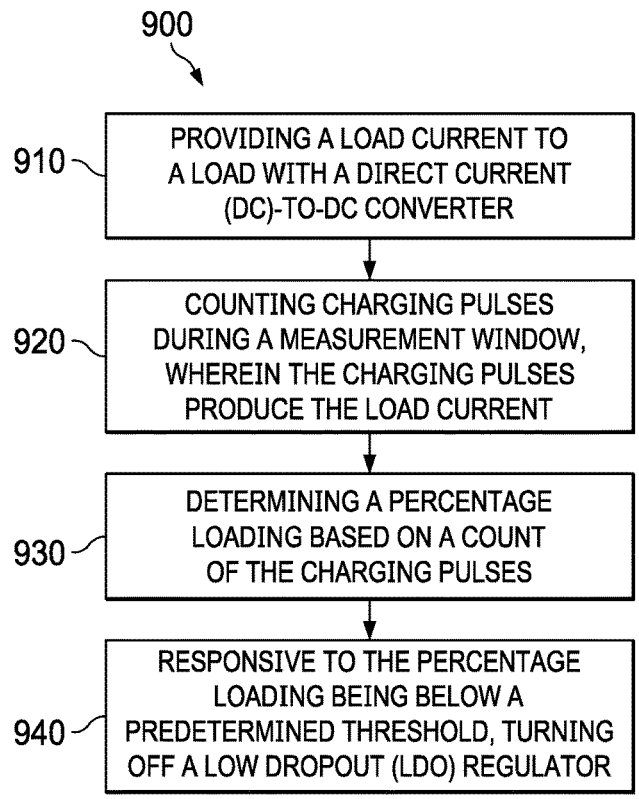
FIG. 9 is a flow diagram of a method for safely and reliably disabling an LDO regulator in accordance with various examples.

FIG. 9 is a flow diagram of a method 900 for safely and reliably disabling an LDO regulator 108 in accordance with various examples herein. The steps of method 900 may be performed in any suitable order. The hardware components described above with respect to FIGS. 1, 2, and 4 may perform method 900 in some examples. Any suitable hardware or digital logic may perform method 900 in some examples.

Method 900 begins at 910, where a DCDC converter, such as DCDC converter 106, provides a load current to a load 102. The DCDC converter may be any suitable voltage regulator.

Method 900 continues at 920, where a counter counts charging pulses during a measurement window, where the charging pulses produce the load current. As an example, PON counter 210 counts charging pulses. The charging pulses may be delivered to an inductor coupled to the DCDC converter 106 over a predefined duration of time.

Method 900 continues at 930, where a latch determines a percentage loading based on a count of the charging pulses. In one example, DCDC load latch 220 determines the percentage loading. The DCDC load latch 220 receives the count of the charging pulses from PON counter 210.

Method 900 continues at 940, where, responsive to the percentage loading being below a predetermined threshold, a disable signal turns off an LDO regulator, such as LDO regulator 108. The LDO regulator 108 is turned off if it was previously enabled for load sharing with DCDC converter 106. In one example, a digital comparator such as comparator 408 performs a comparison and turns off the LDO regulator 108 responsive to the percentage loading from DCDC load value at output 260 being below a DCDC load threshold from DCDC load threshold encoder 406. If the percentage loading is below the DCDC load threshold, the LDO regulator 108 is not needed because the DCDC converter 106 can handle the load requirements.

Examples herein provide a flexible and reliable operating scheme for safely turning off an LDO regulator. The scheme described herein avoids unexpected LDO regulator 108 on/off cycles that may cause ripple on a regulated voltage supply rail leading to degraded RF performance on the device. The examples herein improve DCDC operational efficiency because the peak current setting is adjusted based on the DCDC load conditions. In an example, a 5% improvement may be seen in DCDC efficiency by using an optimal $I_{PEAK}$ setting for a specific load current rather that the maximum $I_{PEAK}$ setting. In examples herein, the LDO regulator 108 is turned on for load current sharing only if the DCDC converter 106 is incapable of handling the load current demand itself, even with the maximum $I_{PEAK}$ setting. Software-based schemes may be used in some examples for direct control of adjusting $I_{PEAK}$ settings by checking the DCDC load meter 112 output. In other examples, the schemes described herein are hardware managed and do not require software implementation. The schemes described herein may be implemented using digital logic.

Also, in some examples, the measured load current value is provided after two load meter measurement windows for stable and reliable operation. In some examples, if the LDO regulator 108 is enabled, it remains enabled for at least two load meter measurement windows to avoid frequent LDO regulator 108 on/off cycles. A user may define high and low threshold values for the adaptive DCDC peak current scheme in some examples, which provides increased flexibility for various applications.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Unless otherwise stated, "about," "approximately," or "substantially" preceding a value means+/−10 percent of the stated value. Modifications are possible in the described examples, and other examples are possible within the scope of the claims.

What is claimed is:

1. A device, comprising:
   a direct current (DC)-to-DC converter configured to provide a load current to a load;
   a low dropout (LDO) regulator coupled to the DC-to-DC converter; and
   a controller configured to:
      determine the load current;
      turn on the LDO regulator if the load current is above a predetermined threshold;
      turn off the LDO regulator if the load current is below the predetermined threshold;
      count a number of charging pulses during a measurement window;
      determine a percentage loading of the DC-to-DC converter based on the number of charging pulses; and
      provide the percentage loading to a comparator.

2. The device of claim 1, wherein the controller is configured to:
   compare the percentage loading to the predetermined threshold with the comparator; and
   responsive to the comparison, turn off the LDO regulator.

3. The device of claim 1, further comprising:
   determining the percentage loading by counting the number of charging pulses over two or more measurement windows.

4. The device of claim 1, wherein the controller is configured to:
   enable the comparator after two or more measurement windows.

5. The device of claim 1, wherein the controller is configured to:
   adjust a peak current setting for the DC-to-DC converter, wherein the peak current setting indicates a maximum current that the DC-to-DC converter can provide to the load.

6. The device of claim 5, wherein the controller is configured to increase the peak current setting responsive to the percentage loading of the DC-to-DC converter being above a threshold value.

7. The device of claim 5, wherein the controller is configured to decrease the peak current setting responsive to the percentage loading of the DC-to-DC converter being below a threshold value.

8. The device of claim 1, wherein the controller comprises the comparator.

9. A device, comprising:
   a controller including digital logic, wherein the digital logic includes:
      a measurement window generator configured to generate a measurement window;
      a pulse counter configured to provide a count of charging pulses on an inductor coupled to a direct current (DC)-to-DC converter during the measurement window;
      a latch configured to determine a percentage loading based on the count of charging pulses; and
      a comparator configured to compare the percentage loading to a load threshold, wherein the comparator is further configured to disable a low dropout (LDO) regulator based on the comparison.

10. The device of claim 9, wherein the digital logic is configured to:
    enable the comparator after two or more measurement windows.

11. The device of claim 9, further comprising:
    an encoder configured to convert a value stored in a register to the load threshold.

12. The device of claim 9, wherein the digital logic also includes:
    peak current adaptation logic configured to receive the percentage loading and adjust a peak current for the DC-to-DC converter based on the percentage loading.

13. The device of claim 12, wherein the peak current adaptation logic is configured to compare the percentage loading to a first threshold value and to a second threshold value, and further configured to adjust the peak current responsive to the comparisons.

14. A method, comprising:
providing a load current to a load with a direct current (DC)-to-DC converter;
counting charging pulses during a measurement window, wherein the charging pulses produce the load current;
determining a percentage loading based on a count of the charging pulses;
responsive to the percentage loading being below a predetermined threshold, turning off a low dropout (LDO) regulator;
enabling a comparator after two or more measurement windows;
comparing the percentage loading to the predetermined threshold with the comparator; and
turning the LDO regulator off responsive to an output of the comparator.

15. The method of claim 14, wherein the charging pulses are pulses on an inductor coupled to the DC-to-DC converter.

16. A method, comprising:
providing a load current to a load with a direct current (DC)-to-DC converter;
counting charging pulses during a measurement window, wherein the charging pulses produce the load current;
determining a percentage loading based on a count of the charging pulses;
responsive to the percentage loading being below a predetermined threshold, turning off a low dropout (LDO) regulator; and
adjusting a peak current setting for the DC-to-DC converter, wherein the peak current setting indicates a maximum current that the DC-to-DC converter can provide to the load.

17. The method of claim 16, further comprising:
enabling a comparator after two or more measurement windows;
comparing the percentage loading to the predetermined threshold with the comparator; and
turning the LDO regulator off responsive to an output of the comparator.

18. The method of claim 16, further comprising:
increasing the peak current setting if the percentage loading of the DC-to-DC converter is above a threshold value.

19. The method of claim 18, further comprising:
responsive to the percentage loading being above the threshold value, turning on the LDO regulator.

20. The method of claim 16, further comprising:
decreasing the peak current setting if the percentage loading of the DC-to-DC converter is below a threshold value.

\* \* \* \* \*